US006617673B2

(12) United States Patent
Lee et al.

(10) Patent No.: US 6,617,673 B2
(45) Date of Patent: Sep. 9, 2003

(54) MEMORY CARD

(75) Inventors: Joon Ki Lee, Seoul (KR); Woon Ky Ha, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/953,704

(22) Filed: Sep. 11, 2001

(65) Prior Publication Data

US 2002/0030256 A1 Mar. 14, 2002

Related U.S. Application Data

(62) Division of application No. 09/476,918, filed on Jan. 4, 2000, now Pat. No. 6,323,064.

(30) Foreign Application Priority Data

Oct. 11, 1999 (KR) ........................................... 99-43733

(51) Int. Cl.[7] ............................................ H01L 23/495

(52) U.S. Cl. ...................... 257/676; 275/668; 275/686; 275/723

(58) Field of Search ......................... 257/40, 723, 676, 257/686, 668; 437/209; 235/487

(56) References Cited

U.S. PATENT DOCUMENTS

| | | | | |
|---|---|---|---|---|
| 4,910,582 A | | 3/1990 | Miyamoto et al. | 357/74 |
| 5,280,193 A | | 1/1994 | Lin et al. | 257/723 |
| 5,311,396 A | * | 5/1994 | Steffen | 361/736 |
| 5,353,498 A | * | 10/1994 | Fillion et al. | 29/840 |
| 5,530,289 A | | 6/1996 | Hirano et al. | 257/723 |
| 5,544,007 A | * | 8/1996 | Inoue | 361/684 |
| 5,635,756 A | | 6/1997 | Kohno et al. | 257/676 |
| 5,677,246 A | | 10/1997 | Maeta et al. | 437/209 |
| 5,877,478 A | | 3/1999 | Ando | 257/686 |
| 5,979,772 A | | 11/1999 | Takei et al. | 235/487 |
| 6,002,605 A | * | 12/1999 | Iwasaki et al. | 365/51 |
| 6,049,975 A | | 4/2000 | Clayton | 257/668 |
| 6,121,681 A | | 9/2000 | Tanaka et al. | 257/723 |
| 6,361,369 B1 | * | 3/2002 | Kondo et al. | 439/630 |

OTHER PUBLICATIONS http://www.travan.com/Products > Tape Storage—Data Center > 3590/3490E Tape Cartridges > Brochures &Literature, p. 7.*

* cited by examiner

*Primary Examiner*—Vu A. Le
*Assistant Examiner*—Michael K. Luhrs
(74) *Attorney, Agent, or Firm*—Harness, Dickey & Pierce, P.L.C.

(57) ABSTRACT

A memory card includes a substrate and a resin-molded layer. The substrate includes contact pads that are on a second face thereof for communication with a card reader. Semiconductor chips are on a first face of the substrate and electrically connected to the contact pads through bonding wires and circuit wiring. The resin-molded layer is on the first face and covers the chips.

12 Claims, 9 Drawing Sheets

MEMORY CARD

CROSS REFERENCE TO RELATED APPLICATION

This application is a divisional of, and claims priority from, U.S. patent application Ser. No. 09/476,918, filed Jan. 4, 2000, now U.S. Pat. No. 6,323,064, issued Nov. 27, 2001, which in turn claims priority from Korean Application No. 99-43733 filed Oct. 11, 1999.

BACKGROUND OF THE INVENTION

1. Field of the Invention

The present invention relates to semiconductor devices in general and more specifically to a memory card having a resin-molded layer without a plastic card base and a process for making memory cards.

2. Description of the Prior Art

A conventional memory card includes a card base made of plastic material. A molded package containing a semiconductor chip is inserted in and attached to the plastic card base. The package typically includes a printed circuit board having contact pads thereon. A circuit pattern in and on the circuit board electrically connects the contact pads to the chip mounted on the opposite side of the circuit board. The contact pads provide an electrical connection between the memory card and a card reader.

FIG. 1 shows an exploded perspective view of one example of a known memory card 10. In FIG. 1, the memory card 10 includes a plastic card base 13 into which a package 11 fits. An adhesive tape 12 attaches the package 11 to the card base 13. The card base 13 has two recessed areas 15 and 17 sized to receive the package 11. One recessed area 15 receives a resin-molded part 14 of the package 11, and the other recessed area 17 accepts a circuit board 16 and the adhesive tape 12.

Since the memory card 10 has two main members, namely, the package 11 and the card base 13, the process for manufacturing the memory card 10 requires two separate sub-processes that fabricate the respective members and a following sub-process to combine the package 11 and the card base 13. The number of processing steps makes this conventional process complicated. In addition, the process has significant drawbacks when producing the memory cards in large quantities because each package should be separately combined with the respective card base. Further, the requirement for multiple members (the card base, the package, and the adhesive tape) leads to higher manufacturing costs.

Memory cards have been widely used in electronic devices such as digital cameras, personal digital assistants, musical instruments, voice recorders, facsimile machines, printers, scanners, word processors, game machines, PC cards, and the like. The general trend in devices using the memory card is to make the devices smaller, lighter, thinner, more reliable, and less expensive. Meeting this trend requires smaller memory cards, but reducing the size of the memory cards is difficult because of the structural limitations that the card base imposes.

SUMMARY OF THE INVENTION

The present invention provides a simpler and smaller memory card by eliminating the conventional card base. Further, the present invention provides a process for making multiple memory cards, simultaneously, simply, and inexpensively.

One embodiment of the present invention provides a process for making a plurality of memory cards. Each of the memory cards includes a plurality of contact pads through which the memory card communicates with an outside card reader. The process begins with a multi-substrate. The multi-substrate includes a plurality of unit substrates, each of which is for each corresponding memory card. Each unit substrate has first and second faces, circuit wiring on the first face, and the contact pads on the second face. The contact pads on each unit substrate electrically connect to the circuit wiring. Semiconductor chips are attached to the multi-substrate. At least one semiconductor chips is on each of the unit substrates and electrically connects to the circuit wiring of the respective unit substrate. A continuous resin-molded layer is formed on the multi-substrate. The continuous resin-molded layer covers the plurality of semiconductor chips and the circuit wirings, and extends over the plurality of unit substrates. Separating the unit substrates of the multi-substrate divides the continuous resin-molded layer into individual resin-molded layers on the respective unit substrates and thereby provides the memory cards. Each of the memory cards has a first surface formed from the unit substrate and an opposing second surface formed from the individual resin-molded layer.

In a preferred embodiment of the present invention, the multi-substrate includes at least two groups of the unit substrates. Each group includes unit substrates that are regularly and continuously arranged side by side. From one to eight of the semiconductor chips are on the first face of each unit substrate. One or more semiconductor chips directly attaches to the first face of each unit substrate. Optionally, semiconductor chips may be stacked on the attached chips. The formation of the continuous resin-molded layer may include setting the multi-substrate in a mold that has a cavity covering the unit substrates, injecting a molding resin into the cavity to form the continuous resin-molded layer, and taking the multi-substrate out of the mold after hardening the molding resin. Alternatively, when the multi-substrate includes at least two groups of the unit substrates, the mold may have at least two cavities, each cavity covering all unit substrates in a corresponding group. The process of the present invention may further include, after separating the multi-substrate, finishing the individual resin-molded layer of each memory card so that the individual resin-molded layer includes an inclined plane at one edge and a groove next to the opposite edge.

Another embodiment of the present invention provides a memory card including a plurality of contact pads. The contact pads are for electrical paths through which the memory card communicates with an outside card reader. The memory card includes a substrate having first and second faces, circuit wiring on the first face, and the contact pads on the second face. The contact pads electrically connect to the circuit wiring. The memory card also includes at least one semiconductor chip that is electrically connected to the circuit wiring on the first face. Moreover, the memory card comprises a resin-molded layer that is on the first face and covers the semiconductor chip and the circuit wiring. Accordingly, a first surface of the memory card is formed from the substrate, and an opposing second surface is formed from the resin-molded layer.

In a preferred embodiment of the present invention, side faces of the substrate and the resin-molded layer are coplanar. Furthermore, the resin-molded layer may have an inclined plane at one edge and a groove next to the opposite edge. The semiconductor chip may be a non-volatile memory chip. The contact pads may have wavy or stepped patterns for preventing data loss when the memory card is being inserted into or withdrawn from the card reader.

BRIEF DESCRIPTION OF THE DRAWINGS

FIGS. 2 and 2A are cross-sectional views of a memory card according to an embodiment of the present invention.

Use of the same reference symbols in different figures indicates similar or identical items.

DETAILED DESCRIPTION OF THE INVENTION

The present invention will now be described more fully with reference to accompanying drawings, which show exemplary embodiments of the invention. This invention may, however, be embodied in many different forms and should not be construed as limited to the embodiments set forth herein. Rather, these exemplary embodiments are provided so that this disclosure will be thorough and complete, and will convey the scope of the invention to those skilled in the art.

Figure 2:
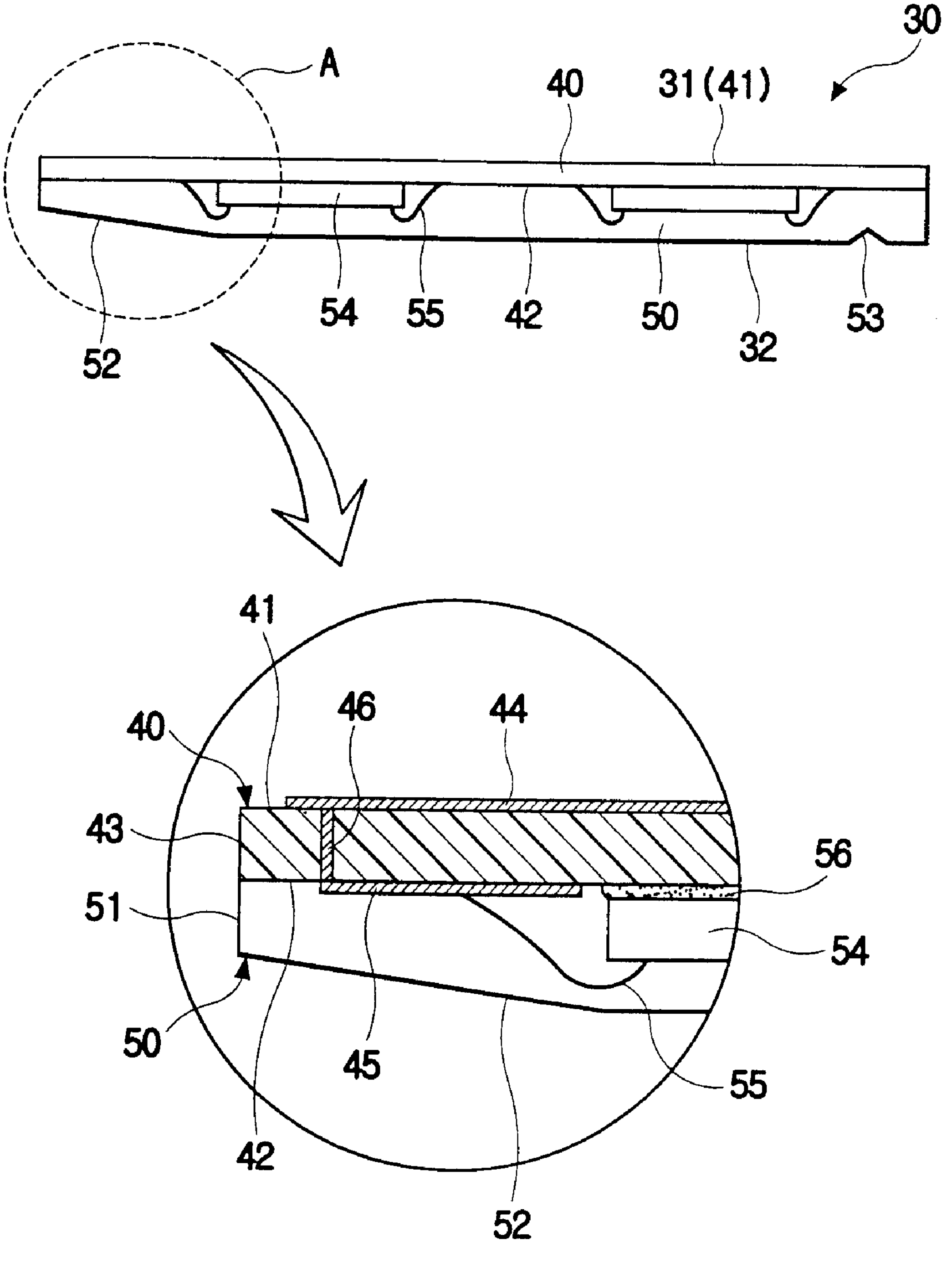

FIG. 2 shows a memory card 30 that includes a substrate 40 and a resin-molded layer 50, but does not include a plastic card base or adhesive tape. Instead of the plastic card base, the resin-molded layer 50 forms half of a body of the memory card 30. The substrate 40 forms the remaining half of the card body. Therefore, the substrate 40 and the resin-molded layer 50 respectively form a first surface 31 and an opposing second surface 32 of the memory card 30. Side surfaces 43 and 51 of the substrate 40 and the resin-molded layer 50 are coplanar, as depicted in FIG. 2A.

The substrate 40 is preferably a conventional printed circuit board, but other kinds of substrate can be also used. A preferred material for the substrate 40 is a resin, such as a bismaleimidetraizine (BT) resin or glass-epoxy resin. On both faces of the substrate 40, desired conductive patterns are formed. Specifically, contact pads 44 are on an outside face 41 that will form the first surface 31 of the memory card 30, and circuit wiring 45 is on an inside face 42 that will adjoin the resin-molded layer 50. The contact pads 44 and the circuit wiring 45 electrically connect through via holes 46.

The shape and position of the contact pads 44 and circuit wiring 45 depend on the type or application of the memory card 30 or other functional needs. The contact pads 44 are the external terminals through which the memory card 30 communicates with an outside card reader (not shown). In particular, the contact pads 44 provide a path for electrical signals while the memory card 30 is inserted into and in contact with the card reader. Therefore, the contact pads 44 are on the outside face 41 of the substrate 40, which becomes the first surface 31 of the memory card 30.

Figure 4:
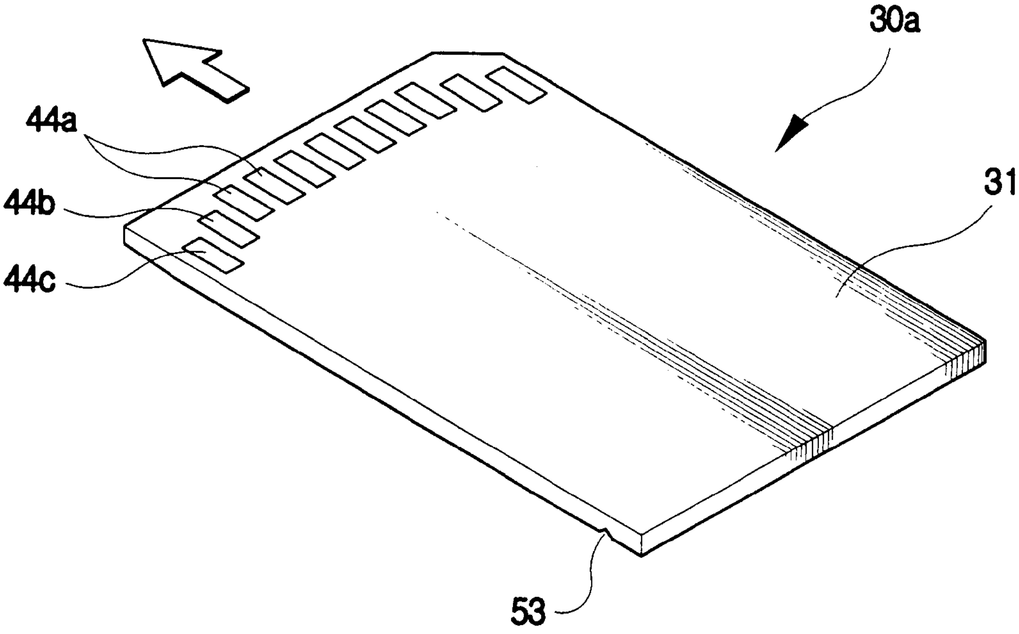
FIG. 4 is a perspective view showing contact pads of a memory card according to an embodiment of the present invention.
Figure 5:
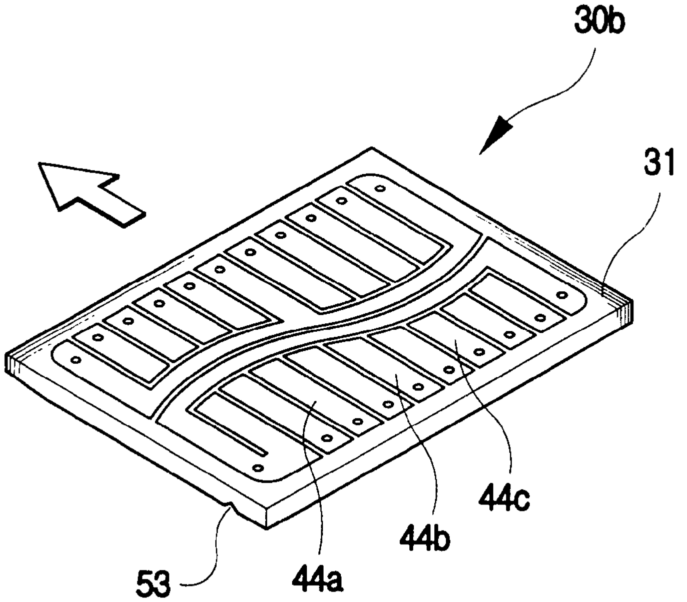
FIG. 5 is a perspective view showing contact pads of a memory card according to another embodiment of the present invention.

According to preferred embodiments of the present invention, the contact pads 44*a*, 44*b*, and 44*c* have the stepped pattern shown in FIG. 4 or the wavy pattern shown in FIG. 5. These patterns for the contact pads 44*a*, 44*b*, and 44*c* help prevent data loss when the memory card 30*a* or 30*b* is being inserted into or withdrawn from the card reader. For example, in both FIGS. 4 and 5, respective pads 44*a*, 44*b* and 44*c* make or break contact with the card reader in order.

Returning to FIG. 2, an adhesive material 56 attaches the semiconductor chips 54 to the substrate inside face 42, and bonding wires 45 electrically connect the circuit wiring 45 to pads (not shown) on the semiconductor chips 54. Accordingly, the semiconductor chips 54 electrically connect to the contact pads 44 through the bonding wires 55, the circuit wiring 45, and the via holes 46. Semiconductor chips 54 are typically non-volatile memory (NVM) chips such as NAND-type flash memory chips. However, the memory card 30 can contain other devices such as capacitors, controllers, or other types of memory devices. In an exemplary embodiment, the memory card 30 accommodates from one to eight of the semiconductor chips 54, where each chip 54 has a memory capacity of 16 MB, 32 MB, 64 MB, 128 MB or more. When two or more chips 54 are on the memory card 30, respective chips 54 are directly attached to the substrate 40 or are stacked onto already attached chips.

Figure 3:
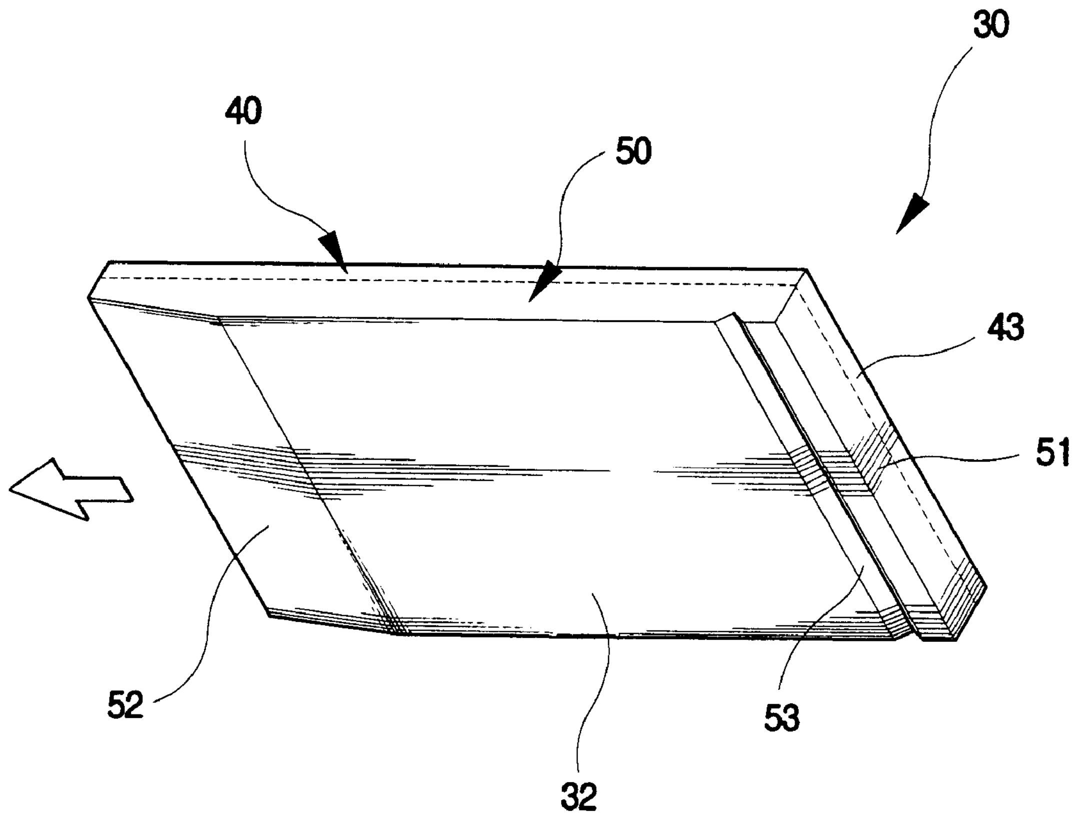
FIG. 3 is a perspective view showing the bottom side of a memory card according to an embodiment of the present invention.

The resin-molded layer 50 is on the inside face 42 of the substrate 40, and therefore covers the semiconductor chips 54 and the circuit wiring 45. The resin-molded layer 50 protects the chips 54 from the surrounding environment and forms the body of the memory card 30. Injecting a molding resin such as epoxy molding compound into a mold can form the resin-molded layer 50. Optionally, an inclined plane 52 may be formed at one edge of the resin-molded layer 50 to facilitate insertion of the memory card 30 into the card reader. Similarly, a groove 53 can be formed next to the opposite edge of the resin-molded layer 50 to facilitate withdrawal of the memory card 30 from the card reader. FIG. 3 shows the inclined plane 52 and the groove 53 on the resin-molded layer 50, that is, on the second surface 32 of the card 30.

Figure 6:
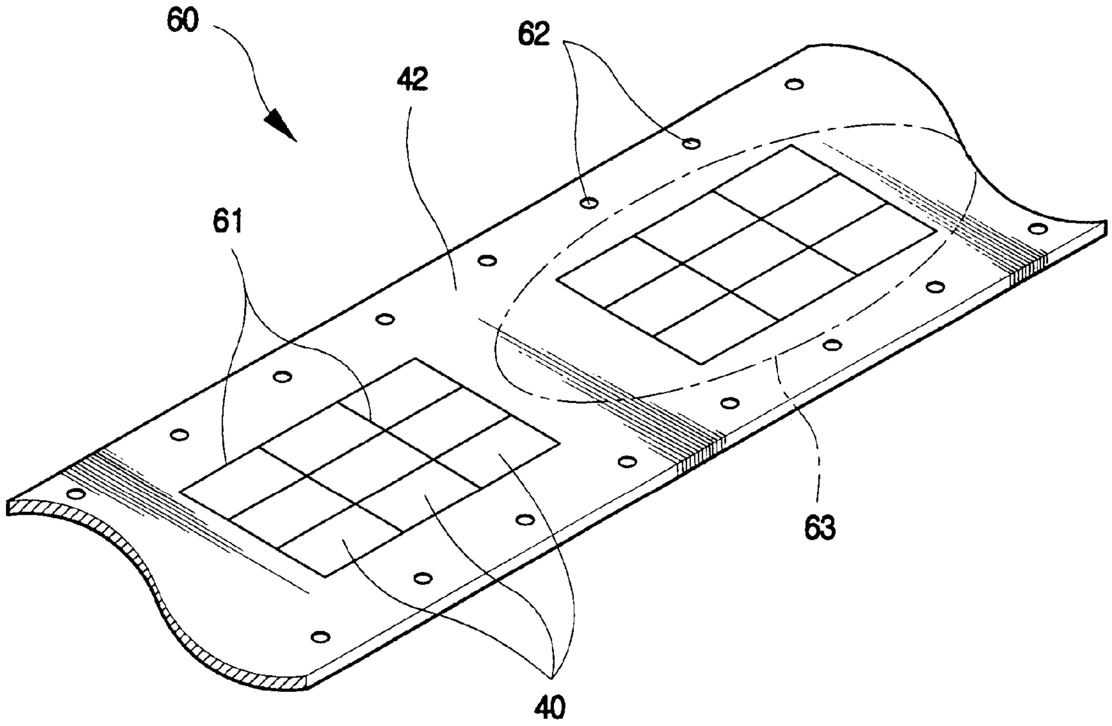
FIGS. 6 to 10 are perspective views or cross-sectional views illustrating a method for making memory cards according to one embodiment of the present invention.

FIGS. 6 to 10 illustrate one manufacturing process in accordance with the invention. FIG. 6 shows a perspective view of a strip-like multi-substrate 60 for the manufacture of memory cards. Lines 61 designate sections of the multi-substrate 60 that form a plurality of unit substrates 40. Each of the unit substrates 40 will be part of a corresponding memory card. The number and configuration of the unit substrates 40 in the multi-substrate 60 can be varied widely. For example, a grid-shaped array on the multi-substrate 60 can include nine, twelve, sixteen, twenty, or more unit substrates 40, and the multi-substrate 60 can include multiple separate arrays or groups 63 of unit substrates 40, as shown in FIG. 6. The unit substrates 40 in the respective groups 63 are regularly and continuously arranged side by side. Opposite edges of the multi-substrate 60 may include through holes 62 for holding or transferring the multi-substrate 60 during the fabrication process.

Each unit substrate 40 is identical in structure to the substrate of the memory card 30 described above. In particular, the circuit wiring (45 in FIG. 2) and the contact pads (44 in FIG. 2) are on the inside face 42 and the outside face (41 in FIG. 2), respectively. Although these conductive patterns are on the respective unit substrates 40, the patterns are omitted from FIGS. 6 to 10 to improve the clarity of the drawings.

Figure 7:
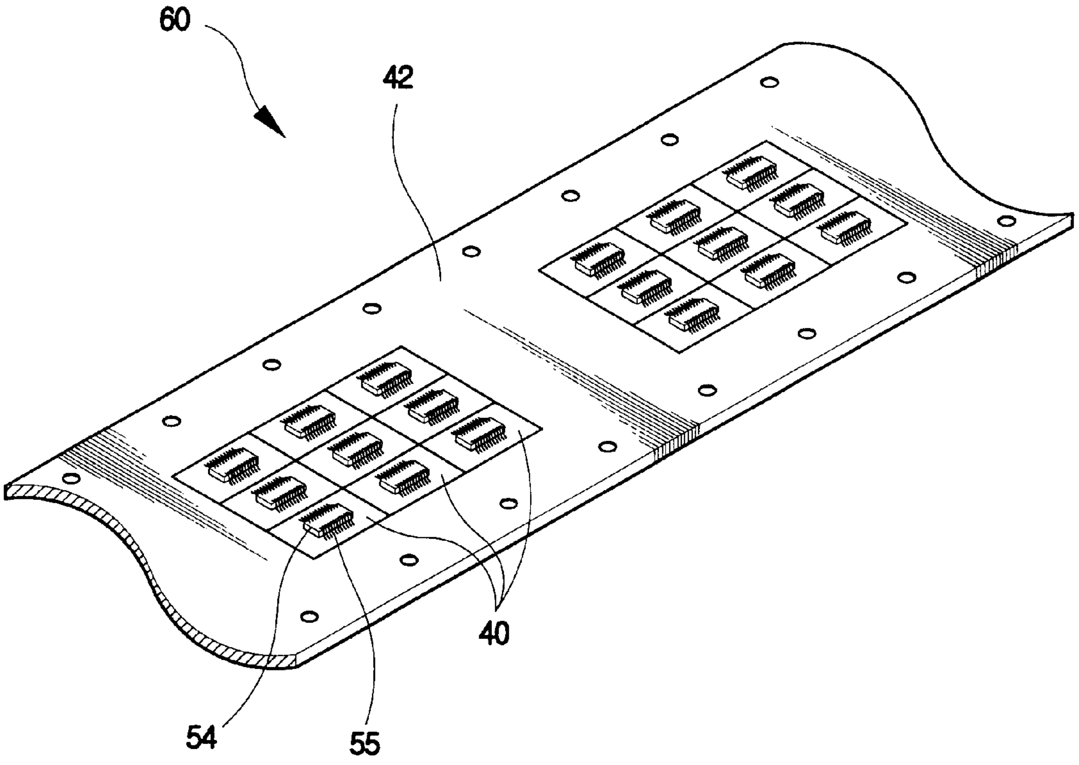

After the multi-substrate 60 is prepared, the semiconductor chips 54 are attached to the inside face 42 of each unit substrate 40 and then electrically connected to the circuit wiring on the associated unit substrate 40, as shown in FIG. 7. An adhesive material such as epoxy can attach the chips 54 to the unit substrates 40, and fine bonding wires such as gold can make the electrical connections between the chips 54 and the wiring on the unit substrates 40. In the embodiment of FIG. 7, a single chip 54 is attached to each unit substrate 40. In alternate embodiments, two or more chips are attached to each unit substrate as illustrated in FIG. 2. Additionally, some chips can be stacked on already attached chips.

Figure 8:
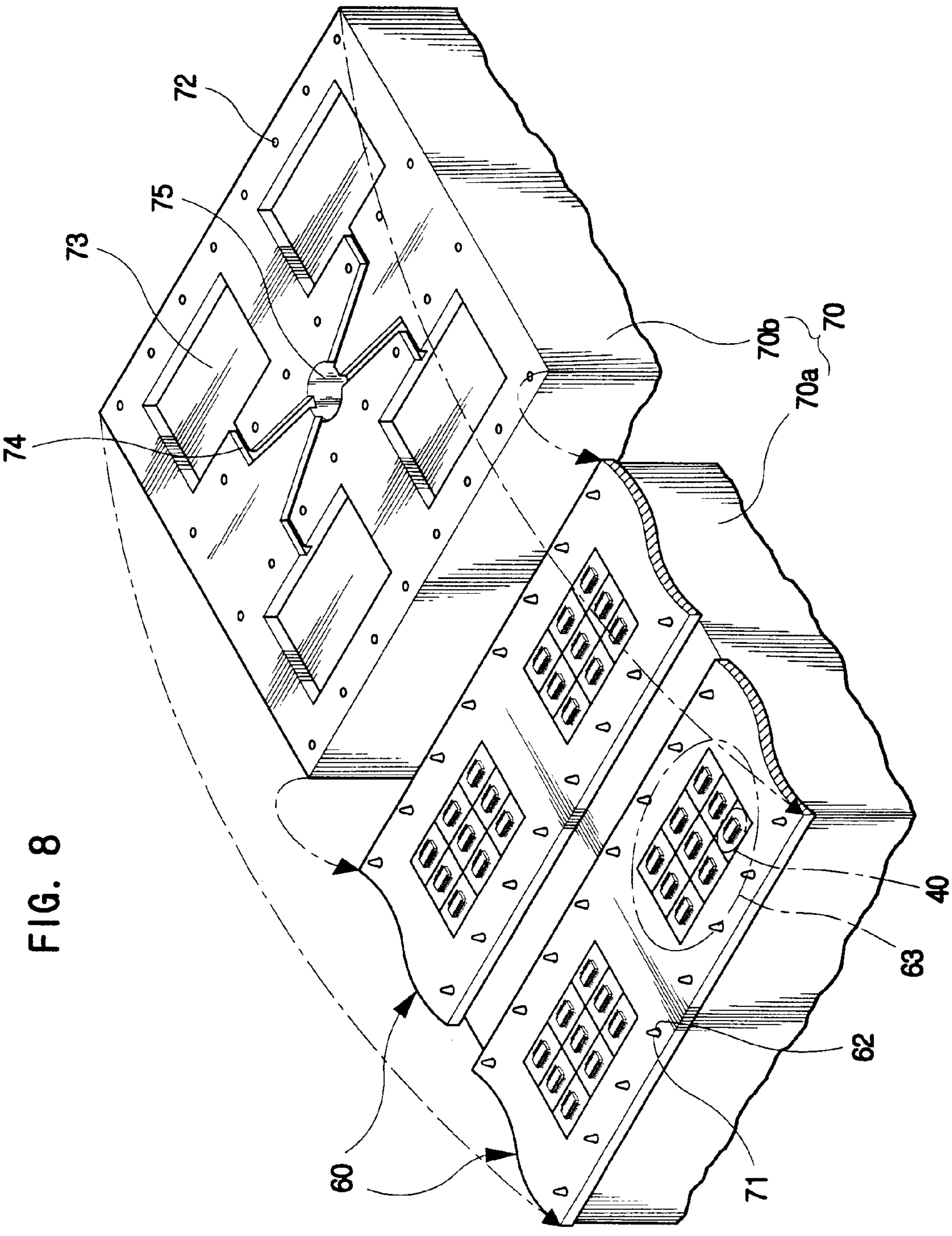

After attaching and electrically connecting the semiconductor chips on the respective unit substrates 40, a resin-molded layer is formed on the multi-substrate 60. As will be described in detail below, the present invention provides a "group molding process." The group molding process simultaneously forms the resin-molded layers of multiple memory cards and thus makes possible the simultaneous manufacture of many memory cards. FIG. 8 shows an exploded perspective view of one example of a mold 70 for the group molding process, and FIG. 9 schematically shows a cross-sectional view illustrating the injection of resin into the mold 70 of FIG. 8.

As shown in FIG. 8, the mold 70 includes a lower mold **70*a* and an upper mold 70*b*. Guide pins 71 extend from the lower mold 70*a* and have positions corresponding to the holes 62 in the multi-substrate 60 and to holes 72 in the upper mold 70*b*. To form the resin-molded layer, the multi-substrate 60 is set in the mold 70. Specifically, the multi-substrate 60 lies on the lower mold 70*a* when the upper mold 70*b* is open. The guide pins 71 are inserted through the holes 62 to align the multi-substrate 60 with the lower mold 70*a*. Next, the upper mold 70*b* is closed and then presses the multi-substrate 60 with the guide pins 71 fit into the holes 72 in the upper mold 70*b*. FIG. 8 shows an embodiment of the invention where multiple multi-substrates 60 fit into the single mold 70 for simultaneous formation of the resin-molded layers of the multi-substrates 60**.

The upper mold **70*b* contains cavities 73, gates 74, a pot 75, and the holes 72. Each cavity 73 is a space into which a molding resin is injected and in which the resin-molded layer forms. Gates 74 are passageways along which the molding resin flows to the cavities 73, and the pot 75 is another passageway for introduction of the molding resin into the mold 70 and delivery of molding resin to the gates 74. As seen from FIG. 9 as well, each cavity 73 confronts a corresponding group 63 of unit substrates 40 on the multi-substrate 60 and covers all unit substrates 40 in the corresponding group 63. Therefore, the unit substrates 40 in each group 63 are simultaneously molded in each cavity 73**, to form a continuous resin-molded layer.

Figure 9:
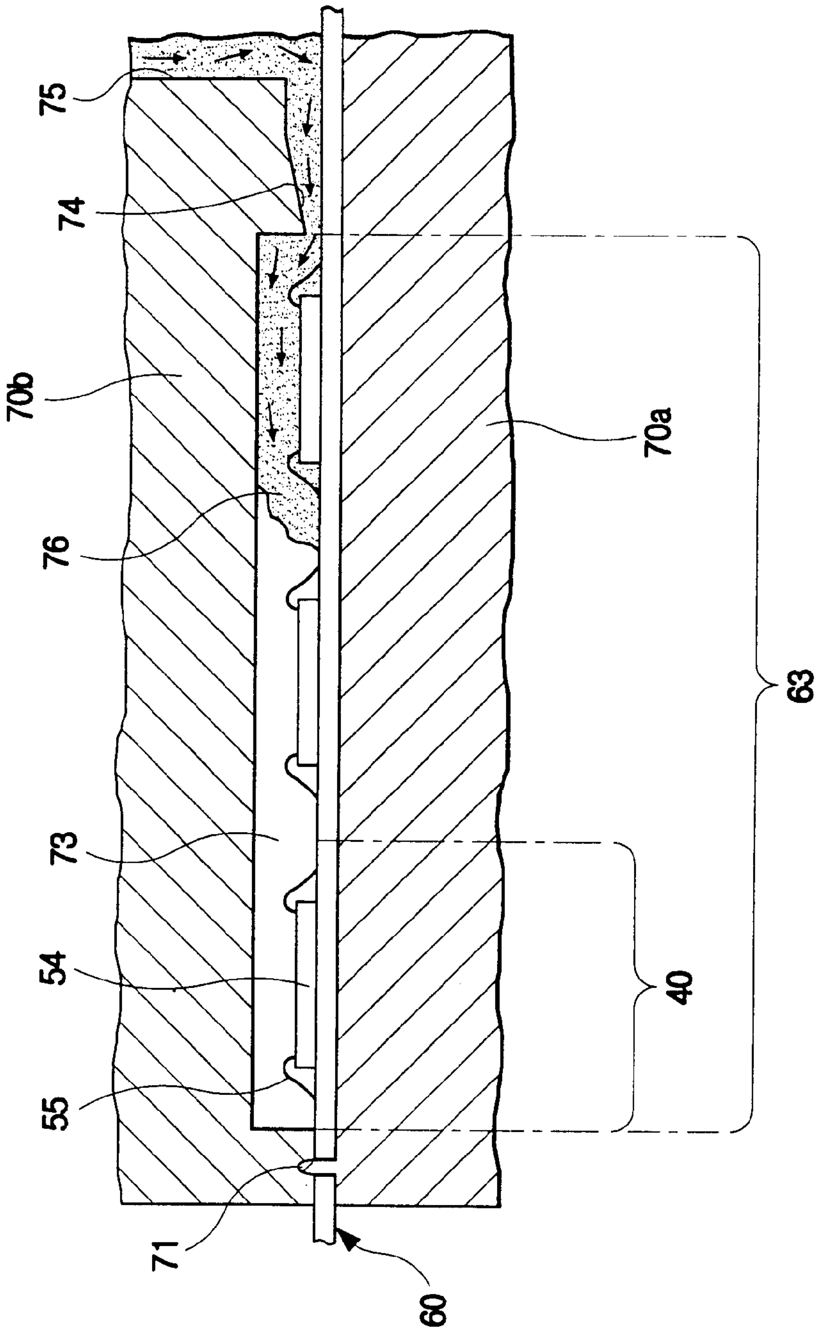

FIG. 9 illustrates how the molding resin 76 entering the pot 75 is injected into one of the cavities 73 through a corresponding gate 74. The molding resin 76, typically an epoxy molding compound at a temperature more than 150° C., fills the cavity 73 in a few minutes and covers the chips 54, the bonding wires 55, and the circuit wiring (not shown) on the unit substrates 40. As stated above, since the cavity 73 covers all unit substrates 40 in the group 63, the continuous resin-molded layer corresponding to the cavity 73 also extends over all unit substrates 40.

Figure 10:
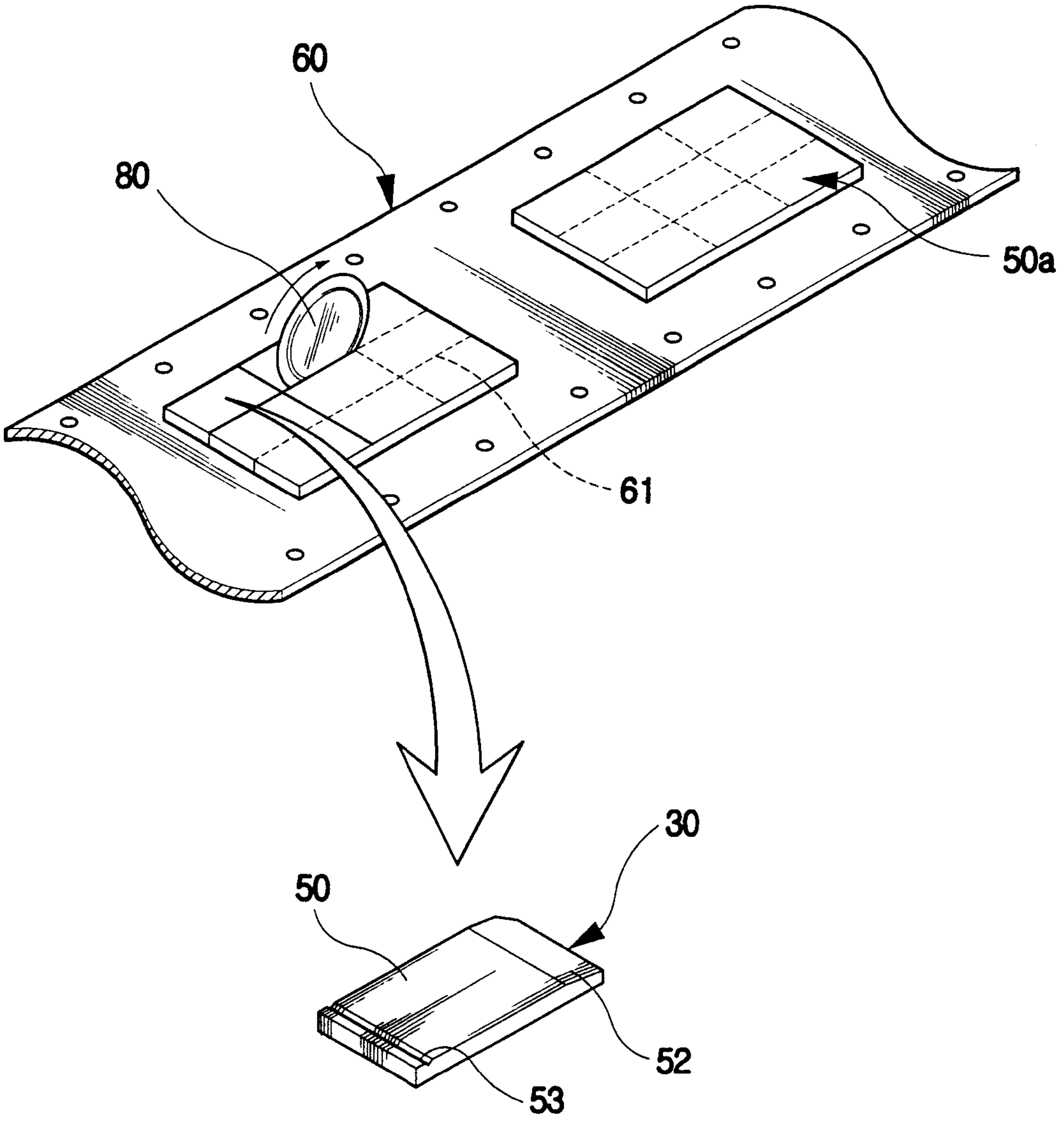

After the molding resin 76 hardens, the multi-substrate 60 is removed from the mold 70, and the continuous resin-molded layer **50*a* is obtained as shown in FIG. 10. The multi-substrate 60 and the continuous resin-molded layer 50 are then cut to form multiple memory cards 30, each including a unit substrate 40 having an individual resin-molded layer 50 on the unit substrate 40. A cutter 80, which separates of the memory cards 30 from the multi-substrate 60, can be a rotating blade as shown in FIG. 10, a laser, a router, or a drill. Such cutters are well known in the art and commonly used, however other equivalent tools can be used as alternatives. For example, a press equipped with blades can be used as the cutter 80. When the press presses down on the multi-substrate 60, the blades cut along the lines 61 of the multi-substrate 60 and simultaneously separate all memory cards 30**. Particle cleaner and/or de-ionized water may be also used.

After the separation of the memory cards 30, the resin-molded layer 50 of the memory card 30 can be finished. For example, as stated above, chamfering one edge of the resin-molded layer 50 forms the inclined plane 52, and the groove 53 is formed next to the opposite edge of the resin-molded layer 50. Alternatively, the shape of the cavities 73 of mold 70 can provide the desired surface contours including the inclined plane 52 or the groove 53. The inclined plane 52 or the groove 53 is added so that the memory card 30 is easily inserted into or withdrawn from the card reader. Therefore, in addition to the specific form shown in the drawings, any other forms of the memory card are feasible if they achieve the desired effects.

Figure 1:
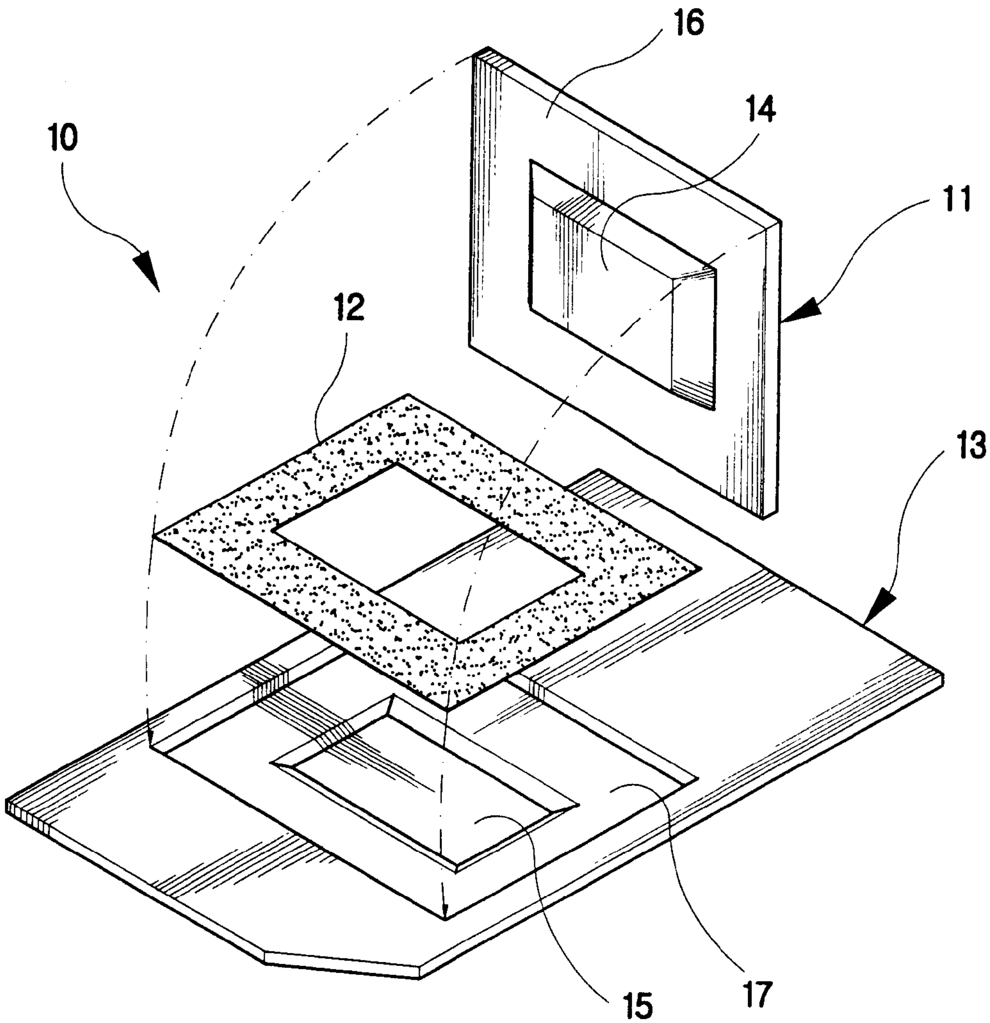
FIG. 1 is an exploded perspective view showing an example of a known memory card.

The memory card 30 is formed from the substrate and the resin-molded layer only without requiring a conventional card base. Therefore, the structure and manufacturing process of the memory card 30 are simpler than the structures and processes requiring a card base. The absence of conventional elements such as the card base and the adhesive tape also facilitates the simultaneous manufacturing of multiple memory cards and thus reduces manufacturing cost. Moreover, the group molding process and subsequent separating of cards according to the present invention make simultaneous manufacture the memory cards possible and also provide an attractive memory card. Further, the group molding process does not require an extra area for setting of each unit substrate in the mold or for space between chip packages, and therefore the memory card can be smaller. Accordingly, a further aspect of the present invention is the ability to manufacture memory cards that are smaller than the prior memory cards. The prior memory card shown in FIG. 1 is typically about 45.0×37.0 mm. However, in accordance with the present invention, a memory card containing the same type and number of chips has a smaller size, for example, 30.0×23.0 mm in case of FIG. 4, or 13.0×17.0 mm in case of FIG. 5.

The drawings and specification illustrate typical preferred embodiments of the invention. Although specific terms are employed, the terms are used in a generic and descriptive sense only and not for purposes of limitation, the scope of the invention being set forth in the following claims.

What is claimed is:

1. A memory card comprising:

a substrate having inside and outside faces, circuit wiring formed on the inside face, and contact pads formed on the outside face and electrically connected to the circuit wiring, wherein the outside face forms a first surface of the memory card;

at least one semiconductor chip on the inside face and electrically connected to the circuit wiring; and a resin layer formed on the entire inside face and covering the semiconductor chip and the circuit wiring, wherein an external surface of the resin layer forms a second surface of the memory card, wherein the resin layer defines a plane extending continuously along one edge of the external surface thereof, and inclined with respect to the external surface thereof.

2. The memory card of claim 1 wherein side faces of the substrate and the resin-molded layer are coplanar.

3. The memory card of claim 1, wherein the semiconductor chip comprises a non-volatile memory chip.

4. The memory card of claim 1, wherein the contact pads define wavy or stepped patterns that help prevent data loss when the memory card is being inserted into or withdrawn from a card reader.

5. A memory card comprising:

a substrate having inside and outside faces, circuit wiring formed on the first face, and contact pads formed on the outside face and electrically connected to the circuit wiring, wherein the outside face forms a first surface of the memory card;

at least one semiconductor chip on the inside face and electrically connected to the circuit wiring; and a resin layer formed on the entire inside face and covering the semiconductor chip and the circuit wiring, wherein an external surface of the resin layer forms a second surface of the memory card, wherein the resin layer defined a groove formed in the external surface thereof.

6. The memory card claim 5, wherein faces the substrate and the resin-molded layer are coplanar.

7. The memory card of claim 5, wherein the semiconductor chip comprises a non-volatile memory chip.

8. The memory card of claim 5 wherein the contact pads define wavy or stepped patterns that help prevent data loss when the memory card is being inserted into or withdrawn from a card reader.

9. A memory card comprising:

a substrate forming a first half of a body of the memory card and having inside and outside faces, circuit wiring on the inside face, and contact pads on the outside face and electrically connected to the circuit wiring, the outside face forming a first surface of the memory card;

at least one semiconductor chip attached to the inside face and electrically connected to the circuit wiring; and a resin layer forming a second half of the body of the memory card, entirely covering the inside face of the substrate to accommodate the semiconductor chip and the circuit wiring, and having an external surface forming a second surface of the memory card.

10. The memory card of claim 9, wherein side faces of the substrate and the resin layer are coplanar.

11. The memory card of claim 9, wherein the semiconductor chip comprises a non-volatile memory chip.

12. The memory card of claim 9, wherein the contact pads define wavy or stepped patterns that help prevent data loss when the memory card is being inserted into or withdrawn from a card reader.

* * * * *